(12) United States Patent
Cheng et al.

(10) Patent No.: US 8,907,381 B2
(45) Date of Patent: Dec. 9, 2014

(54) REDUCED SHORT CHANNEL EFFECT OF III-V FIELD EFFECT TRANSISTOR VIA OXIDIZING ALUMINUM-RICH UNDERLAYER

(71) Applicant: International Business Machines Corporation, Armonk, NY (US)

(72) Inventors: Cheng-Wei Cheng, White Plains, NY (US); Shu-Jen Han, Cortlandt Manor, NY (US); Masaharu Kobayashi, Yorktown Heights, NY (US); Ko-Tao Lee, White Plains, NY (US); Devendra K. Sadana, Pleasantville, NY (US); Kuen-Ting Shiu, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/027,609

(22) Filed: Sep. 16, 2013

(65) Prior Publication Data
US 2014/0332851 A1 Nov. 13, 2014

Related U.S. Application Data

(63) Continuation of application No. 13/888,657, filed on May 7, 2013.

(51) Int. Cl.
*H01L 21/4763* (2006.01)
*H01L 29/78* (2006.01)

(52) U.S. Cl.
CPC ..................................... *H01L 29/78* (2013.01)
USPC .......................................................... 257/201

(58) Field of Classification Search
USPC .......................................... 257/201; 438/604
See application file for complete search history.

(56) References Cited

U.S. PATENT DOCUMENTS

| 4,816,421 | A |   | 3/1989 | Dynes et al. |
| 5,641,980 | A | * | 6/1997 | Yamaguchi et al. .......... 257/347 |

(Continued)

OTHER PUBLICATIONS

W. Xiong et al., "Self-aligned implanted ground-plane fully depleted SOI MOSFET," Electronics Letters, vol. 35, Issue 23, Nov. 11, 1999, pp. 2059-2060.

(Continued)

*Primary Examiner* — Thao P Le
(74) *Attorney, Agent, or Firm* — Scully, Scott, Murphy & Presser, P.C.; Louis J. Percello, Esq.

(57) ABSTRACT

In one embodiment, a method of forming a semiconductor device is provided that may include forming a semiconductor device including a gate structure on a channel portion of III-V semiconductor substrate. The III-V semiconductor substrate including a III-V base substrate layer, an aluminum containing III-V semiconductor layer that is present on the III-V base substrate layer, and a III-V channel layer. Oxidizing a portion of the aluminum containing III-V semiconductor layer on opposing sides of the gate structure. Forming a raised source region and a raised drain region over the portion of the aluminum containing III-V semiconductor layer that has been oxidized. Forming interconnects to the raised source region and the raised drain region.

9 Claims, 4 Drawing Sheets

(56) References Cited

U.S. PATENT DOCUMENTS

| | | | |
|---|---|---|---|
| 6,198,113 B1* | 3/2001 | Grupp | 257/39 |
| 6,891,202 B2 | 5/2005 | Kish, Jr. et al. | |
| 7,335,545 B2 | 2/2008 | Currie | |
| 7,910,419 B2 | 3/2011 | Fenouillet-Beranger et al. | |
| 8,343,819 B2 | 1/2013 | Doris et al. | |
| 8,513,723 B2 | 8/2013 | Booth, Jr. et al. | |
| 2009/0242873 A1 | 10/2009 | Pillarisetty et al. | |
| 2010/0148153 A1 | 6/2010 | Hudait et al. | |
| 2011/0037125 A1* | 2/2011 | Cheng et al. | 257/351 |
| 2011/0127608 A1 | 6/2011 | Cheng et al. | |
| 2012/0187493 A1 | 7/2012 | Doris et al. | |
| 2013/0049090 A1* | 2/2013 | Lindsay et al. | 257/306 |
| 2013/0230949 A1* | 9/2013 | Booth et al. | 438/157 |
| 2013/0309852 A1* | 11/2013 | Kanakasabapathy et al. | 438/585 |

OTHER PUBLICATIONS

W. Xiong et al., "Self-aligned ground-plane FDSOI MOSFET," IEEE International 2002 SOI Conference, Oct. 7-10, 2002, pp. 23-24.

K. Oshima et al., "SOI MOSFETs with buried alumina: Thermal and electrical aspects," Journal of The Electrochemical Society, vol. 151, No. 4, Feb. 2004, pp. G257-G261.

D. Volpe, "Wet selective oxidation of AlAs layers and its application to DBR mirrors," Masters Thesis, Eindhoven University of Technology, Feb. 1997, 103 pages.

Y. Q. Wu et al., "High Performance Deep-Submicron Inversion-Mode InGaAs MOSFETs with maximum Gm exceeding 1.1 mS/μm: New HBr pretreatment and channel engineering," 2009 IEEE International Electron Devices Meeting (IEDM), Dec. 7-9, 2009, 4 pages.

Notice of Allowance dated Jul. 15, 2014 received in the parent U.S. Patent Application, namely U.S. Appl. No. 13/888,657.

* cited by examiner

னnited States Patent

REDUCED SHORT CHANNEL EFFECT OF III-V FIELD EFFECT TRANSISTOR VIA OXIDIZING ALUMINUM-RICH UNDERLAYER

CROSS REFERENCE TO RELATED APPLICATION

This application is a continuation of U.S. patent application Ser. No. 13/888,657, filed May 7, 2013, the entire content and disclosure of which is incorporated herein by reference.

BACKGROUND

The present disclosure relates to semiconductor structures and methods of fabricating the same. More particularly, the present disclosure relates to semiconductor devices containing III-V compound semiconductor materials.

In order to be able to make integrated circuits, such as memory, logic and other devices, of higher integration density than currently feasible, one has to find ways to further downscale the dimensions of field effect transistors, such as metal oxide semiconductor field effect transistors and complementary metal oxide semiconductors. Scaling achieves compactness and improves operating performance in devices by shrinking the overall dimensions of the device. With scaling reaching theoretical limits, new device geometries and materials have been explored. Compound semiconductors are receiving renewed attention for use as channel materials for ultra large scale integration (ULSI) digital logic applications due to their high electron hole mobility.

SUMMARY

In one embodiment, a method of forming a semiconductor device is provided that may include forming a semiconductor device including a gate structure on a channel portion of III-V semiconductor substrate. The III-V semiconductor substrate may include a III-V base substrate layer, an aluminum containing III-V semiconductor layer that is present on the III-V base substrate layer, and a III-V channel layer that is present on the aluminum containing III-V semiconductor layer. A portion of the aluminum containing III-V semiconductor layer may be oxidized on opposing sides of the gate structure. A raised source region and a raised drain region may be formed over the portion of the aluminum containing III-V semiconductor layer that has been oxidized. Interconnects may be formed to the raised source region and the raised drain region. The portion of the aluminum containing III-V semiconductor layer that has been oxidized obstructs the interconnects from penetrating through the aluminum containing III-V semiconductor layer.

In another aspect, a semiconductor device is provided that includes a III-V base semiconductor layer, a III-V ground plane layer present on the III-V base semiconductor layer, and an island of an undoped III-V aluminum containing semiconductor layer that is present on the III-V ground plane layer. The semiconductor device further includes aluminum containing oxide regions that are present on opposing sides of the island of the undoped III-V aluminum containing semiconductor layer. A III-V channel layer is present on the island of the undoped III-V aluminum containing semiconductor layer. A raised III-V source region and a raised III-V drain region are present over the aluminum containing oxide regions. The raised III-V source region and the raised III-V drain region are positioned on opposing sides of the III-V channel layer. A gate structure is present on a channel portion of the III-V channel layer.

DESCRIPTION OF THE DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION

Figure 1:
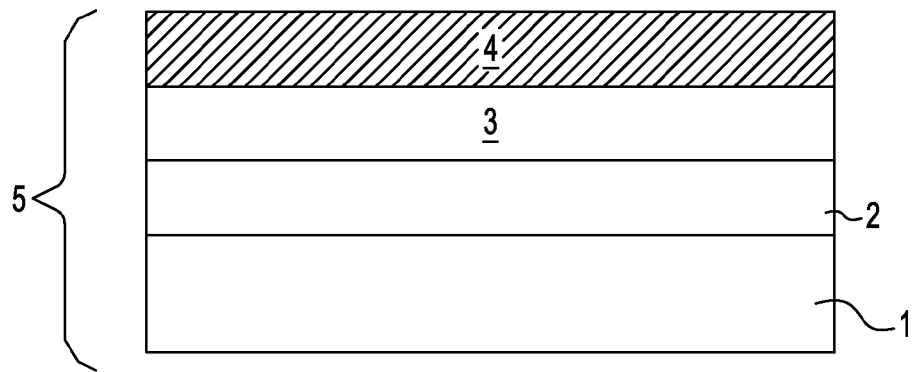
FIG. 1 is a side cross-sectional view depicting a III-V semiconductor substrate including a III-V base substrate layer, a ground plane layer of a doped aluminum containing III-V semiconductor material present on the III-V base substrate layer, an aluminum containing III-V semiconductor layer that is present on the ground plane layer, and a III-V channel layer present on the aluminum containing III-V semiconductor layer, in accordance with the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "top", "bottom", and derivatives thereof shall relate to the disclosed structures and methods, as oriented in the drawing figures. It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present.

The methods and structures that are disclosed herein reduce leakage and short channel effects in semiconductor devices formed on semiconductor substrates that are composed of III-V semiconductor materials. The term "III-V semiconductor" denotes a semiconductor material that includes at least one element from Group III of the Periodic Table of Elements and at least one element from Group V of the Periodic Table of Elements. Typically, the III-V compound semiconductors are binary, ternary or quaternary alloys including III/V elements. Examples of III-V compound semiconductors that can be used in the present invention include, but are not limited to alloys of gallium arsenic (GaAs), aluminum arsenic (AlAs), indium gallium arsenic (InGaAs), indium aluminum arsenic (InAlAs), indium aluminum arsenic antimony (InAlAsSb), indium aluminum arsenic phosphorus (InAlAsP), indium gallium arsenic phosphorus (InGaAsP) and combinations thereof.

In some examples, possible causes of short channel effects in semiconductor devices including semiconductor substrates composed of III-V semiconductor materials may be the result of metal elements from the interconnects diffusing through the substrate, which causes leakage current through the substrate. Another source of leakage is the penetration of an electric field between the source region and the drain region. In some embodiments, the aforementioned sources of short channel effects and leakage may be reduced by forming an oxide material from an aluminum containing III-V semiconductor material underlying the interconnects to the source region and the drain region. Further details of some embodiments of the present disclosure are now described with reference to FIGS. 1-8.

FIG. 1 depicts one embodiment of a III-V semiconductor substrate 5 including a III-V base substrate layer 1, a ground plane layer 2 of a doped aluminum containing III-V semiconductor material present on the III-V base substrate layer 1, an aluminum containing III-V semiconductor layer 3 that is present on the ground plane layer 2, and a III-V channel layer 4 present on the aluminum containing III-V semiconductor layer 3.

In one embodiment, III-V base substrate layer 1 may be composed of a gallium containing III-V semiconductor material, such as gallium arsenic (GaAs). Other examples of III-V semiconductor materials that are suitable for the III-V base substrate layer 1 include aluminum antimonide (AlSb), aluminum arsenide (AlAs), aluminum phosphide (AlP), boron phosphide (BP), boron arsenide (BAs), gallium arsenide (GaAs), gallium phosphide (GaP), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium phosphide (AlGaP), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), gallium indium nitride arsenide aluminum antimonide (GaInNAsSb), gallium indium arsenide antimonide phosphide (GaInAsSbP) and combinations thereof. In one embodiment, the III-V base substrate layer 1 may have a thickness ranging from 10 nm to 1000 μm. In another embodiment, the III-V base substrate layer 1 may have a thickness ranging from 10 nm to 1000 μm. In some embodiments, the III-V base substrate layer 1 may be present on a silicon containing substrate. For example, the silicon containing substrate may include Si, SiGe, SiGeC, SiC and combinations thereof.

Still referring to FIG. 1, a ground plane layer 2 of a doped aluminum containing III-V semiconductor material may be present on the III-V base substrate layer 1. In one embodiment, the ground plane layer 2 of the doped aluminum containing III-V semiconductor material may be composed of aluminum arsenic (AlAs). Other aluminum containing layers that may be employed for the ground plane layer 2 of the doped aluminum containing III-V semiconductor material may be selected from the group consisting of aluminum antimonide (AlSb), aluminum arsenide (AlAs), aluminum phosphide (AlP), aluminum gallium arsenide (AlGaAs), aluminum indium arsenic (AlInAs), aluminum indium antimonide (AlInSb), aluminum gallium phosphide (AlGaP), aluminum gallium indium phosphide (AlGaInP), aluminum gallium arsenide phosphide (AlGaAsP), aluminum indium arsenide phosphide (AlInAsP) and combinations thereof.

The ground plane layer 2 of a doped aluminum containing III-V semiconductor material is doped to an n-type conductivity or p-type conductivity. For the doped aluminum containing III-V semiconductor material that provides the ground plane layer 2, the effect of the dopant atom, i.e., whether it is a p-type or n-type dopant, depends upon the site occupied by the dopant atom on the lattice of the base material. In one example, the ground plane layer 2 of the doped aluminum containing III-V semiconductor material may be doped to an n-type conductivity. In an III-V semiconductor, atoms from Group II act as acceptors, i.e., p-type, when occupying the site of a Group III atom, while atoms in Group VI act as donors, i.e., n-type, when they replace atoms from group V. Dopant atoms from Group IV, such as silicon (Si), have the property that they can act as acceptors or donors depending on whether they occupy the site of Group III or Group V atoms respectively. Such impurities are known as amphoteric impurities. The dopant concentration for the dopant that dictates the conductivity type of the doped aluminum containing III-V semiconductor material that provides the ground plane layer 2 may range from $10^{15}$ atoms/cm$^3$ to $10^{21}$ atoms/cm$^3$. In another embodiment, the dopant concentration that dictates the conductivity type of the type III-V semiconductor material that provides the ground plane layer 2 may range from $10^{16}$ atoms/cm$^3$ to $10^{20}$ atoms/cm$^3$.

In some embodiments, the doped aluminum containing III-V semiconductor material that provides the ground plane layer 2 may be formed using an epitaxial deposition process. The terms "epitaxially formed", "epitaxial growth" and/or "epitaxial deposition" means the growth of a semiconductor material on a deposition surface of a semiconductor material, in which the semiconductor material being grown has the same crystalline characteristics, as the semiconductor material of the deposition surface. Therefore, in the embodiments in which the doped aluminum containing III-V semiconductor material that provides the ground plane layer 2 is formed directly on the III-V base substrate layer 1, the doped aluminum containing III-V semiconductor material will have the same crystal orientation as the III-V base substrate layer 1. The dopant that provides the n-type or p-type conductivity of the doped aluminum containing III-V semiconductor material that provides the ground plane layer 2 may be introduced using an in-situ deposition process as the ground plane layer 2 is being formed, or may be introduced using ion implantation after the base material for the ground plane layer 2 has been deposited.

In one embodiment, the doped aluminum containing III-V semiconductor material that provides the ground plane layer 2 may have a thickness ranging from 5 nm to 1000 nm. In another embodiment, the doped aluminum containing III-V semiconductor material that provides the ground plane layer 2 may have a thickness ranging from 5 nm to 1000 nm.

An aluminum containing III-V semiconductor layer 3 is present on the ground plane layer 2. In one embodiment, the aluminum containing III-V semiconductor layer 3 may be composed of aluminum arsenic (AlAs). Other aluminum containing layers that may be employed for the aluminum containing III-V semiconductor layer 3 may be selected from the group consisting of aluminum antimonide (AlSb), aluminum arsenide (AlAs), aluminum phosphide (AlP), aluminum gallium arsenide (AlGaAs), aluminum indium arsenic (AlInAs), aluminum indium antimonide (AlInSb), aluminum gallium phosphide (AlGaP), aluminum gallium indium phosphide (AlGaInP), aluminum gallium arsenide phosphide (AlGaAsP), aluminum indium arsenide phosphide (AlInAsP) and combinations thereof. The aluminum containing III-V semiconductor layer 3 is an intrinsic semiconductor layer, i.e., it is not intentionally doped to an n-type or p-type conductivity.

In some embodiments, the aluminum containing III-V semiconductor layer 3 may be formed using an epitaxial deposition process. In one embodiment, the aluminum containing III-V semiconductor layer 3 may have a thickness ranging from 5 nm to 1000 nm. In another embodiment, the aluminum containing III-V semiconductor layer 3 may have a thickness ranging from 5 nm to 1000 nm.

Still referring to FIG. 1, the III-V channel layer 4 may be composed of a gallium containing III-V semiconductor material, such as gallium arsenic (GaAs). Other examples of III-V semiconductor materials that are suitable for the III-V channel layer 4 include aluminum antimonide (AlSb), aluminum arsenide (AlAs), aluminum phosphide (AlP), boron phosphide (BP), boron arsenide (BAs), gallium arsenide (GaAs), gallium phosphide (GaP), indium phosphide (InP), aluminum gallium arsenide (AlGaAs), indium gallium phosphide (InGaP), indium gallium arsenide (InGaAs), aluminum indium arsenic (AlInAs), aluminum indium antimonide (AlInSb), gallium arsenide nitride (GaAsN), gallium arsenide antimonide (GaAsSb), aluminum gallium phosphide (AlGaP), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), gallium indium nitride arsenide aluminum antimonide (GaInNAsSb), gallium indium arsenide antimonide phosphide (GaInAsSbP), and combinations thereof.

In one embodiment, the III-V channel layer 4 may have a thickness ranging from 2 nm to 1000 nm. In another embodiment, the III-V channel layer 4 may have a thickness ranging from 2 nm to 10000 nm.

Figure 2:
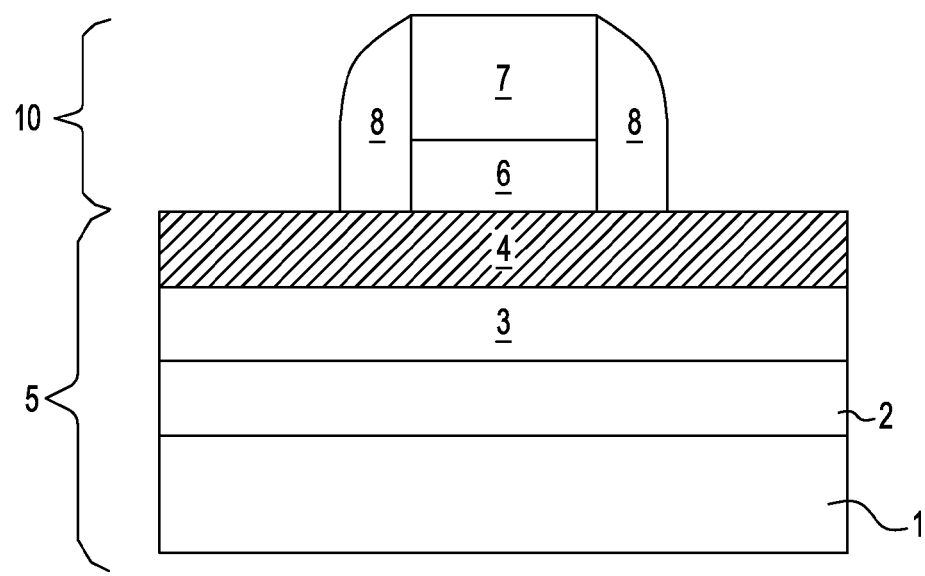
FIG. 2 is a side cross-sectional view depicting forming a gate structure on the III-V channel layer of the III-V semiconductor substrate, in accordance with one embodiment of the present disclosure.

FIG. 2 depicts forming a gate structure 10 on the III-V channel layer 4 of the III-V semiconductor substrate 5. The gate structure 10 is a structure used to control output current, i.e., flow of carriers in the channel, i.e., channel portion, of a semiconducting device, such as a field effect transistor, through electrical or magnetic fields. The channel portion of the semiconductor substrate, i.e., III-V semiconductor substrate 5, is between the source region and the drain region of a semiconductor device, such as a field effect transistor (FET), that becomes conductive when the semiconductor device is turned on. The channel portion of the semiconductor device is present in the III-V channel layer 4. The source region is a doped region in the semiconductor device, in which majority carriers are flowing into the channel portion of the semiconductor substrate, e.g., III-V semiconductor substrate 5. The drain region is the doped region in the semiconductor device that is located at the end of the channel portion of the semiconductor substrate, in which carriers are flowing out of the semiconductor device through the drain region.

The gate structure 10 may include at least one gate dielectric 6 and at least one gate conductor 7. In some embodiments, the at least one gate dielectric 6 is a composed of a high-k dielectric material having a dielectric constant of greater than 4.0, which may be referred to as a high k dielectric. Typically, the high k dielectric has a dielectric constant of about 7.0 or greater, with a dielectric constant of about 10.0 or greater being even more typical. The dielectric constants mentioned herein are relative to a vacuum, unless otherwise stated. Specifically, the high-k dielectric employed in the present disclosure includes, but is not limited to an oxide, nitride, oxynitride and/or silicates including metal silicates, aluminates, titanates and nitrides. In one embodiment, it is preferred that the at least one gate dielectric 6 is comprised of $HfO_2$, $ZrO_2$, $Al_2O_3$, $TiO_2$, $La_2O_3$, $SrTiO_3$, $LaAlO_3$, $Y_2O_3$, a pervoskite oxide, $HfSiO_z$, $HfAlO_z$ or $HfAlO_aN_b$. Preferably, the at least one gate dielectric 6 is a Hf-based dielectric material.

The at least one gate dielectric 6 may be formed utilizing a deposition process including, but not limited to molecular beam epitaxy (MBE), chemical vapor deposition (CVD), plasma enhanced chemical vapor deposition (PECVD), atomic layer deposition (ALD), evaporation, physical vapor deposition (PVD), chemical solution deposition and other like deposition processes.

The thickness of the at least one gate dielectric 6 may vary depending on the deposition technique employed in fabricating the same, as well as the composition and number of dielectrics of the high k dielectrics. Typically, the at least one gate dielectric 6 has a thickness from about 0.5 to about 20 nm. In another embodiment, the at least one gate dielectric has a thickness ranging from about 1 nm to about 10 nm.

The at least one gate conductor 7 of the present disclosure may include any conductive material such as, for example, polysilicon, polysilicon germanium, conductive metals, conductive metal alloys, conductive silicides, conductive nitrides and combinations or multilayers thereof. When metallic-containing gate conductors are employed, the metallic gate conductor can be doped so as to shift the workfunction of the gate conductor. Illustrative examples of dopant ions include As, P, B, Sb, Bi, Al, Ga, Tl or mixtures thereof. The same dopants are also used with polysilicon or polySiGe mentioned above. In some embodiments, the at least one gate conductor 7 is a conductive metal, with Al, Pt, Au, W and Ti being highly preferred. The selection of metal gates is advantageous since conductive metals have different workfunctions that permit one to adjust the threshold voltage of the device. The at least one gate conductor 7 may be formed by a deposition process such as, for example, CVD, PECVD, PVD, plating, thermal or e-beam evaporation and sputtering.

The gate conductor 6 may be patterned by lithography and etching. Specifically, and in one example, a pattern is produced by applying a photoresist to the surface to be etched, exposing the photoresist to a pattern of radiation, and then developing the pattern into the photoresist utilizing a resist developer. Once the patterning of the photoresist is completed, the sections of the sacrificial material covered by the photoresist are protected to provide the gate structure 10, while the exposed regions are removed using a selective etching process that removes the unprotected regions. Following formation of the gate structure 10, the photoresist may be removed.

At least one dielectric gate spacer 8 may then be formed adjacent to the gate structure 10, i.e., in direct contact with the sidewall of the gate structure 10. In one embodiment, the at last one dielectric gate spacer 8 may be formed by using a blanket layer deposition, such as chemical vapor deposition, and an anisotropic etchback method. The at least one dielectric gate spacer 8 may have a width ranging from 2.0 nm to 15.0 nm, and may be composed of a dielectric, such as a nitride, oxide, oxynitride, or a combination thereof.

Still referring to FIG. 2, in some embodiments, after forming the gate structure 10, source and drain regions, i.e., source and drain extension regions, may be formed in the III-V channel layer 4. The source and drain regions may be formed by ion implanting an n-type or p-type dopant into the exposed portions of the III-V channel layer 4 that are present on opposing sides of the gate structure 10. For the type III-V semiconductor material that provides the III-V channel layer 4, the effect of the dopant atom, i.e., whether it is a p-type or n-type dopant, depends upon the site occupied by the dopant atom on the lattice of the base material. In a type III-V semiconductor, atoms from Group II of the periodic table of elements act as acceptors, i.e., p-type, when occupying the site of an atom from Group III of the periodic table of elements, while atoms in Group VI of the Periodic Table of Elements act as donors, i.e., n-type, when they replace atoms from Group V of the Periodic Table of Elements. Dopant atoms from group IV of the Periodic Table of Elements, such as silicon (Si), have the property that they can act as acceptors or donors depending on whether they occupy the site of Group III or Group V atoms respectively. Such impurities are known as amphoteric impurities. The dopant concentration for the dopant that dictates the conductivity type of the type III-V semiconductor material that provides the III-V channel layer 4 may range from $10^{15}$ atoms/cm$^3$ to $10^{21}$ atoms/cm$^3$. In another embodiment, the dopant concentration that dictates the conductivity type of the type III-V semiconductor material ranges from $10^{16}$ atoms/cm$^3$ to $10^{20}$ atoms/cm$^3$.

The above described method of forming the gate structure 10 may be referred to as a "gate first" formation method. In another embodiment, the gate structure 10 may be formed using a "gate last" process. In a gate last process, a sacrificial gate structure is formed prior to forming the source and drain regions, wherein following formation of the source and drain regions the sacrificial gate structure is replaced with a functional gate structure.

Figure 3:
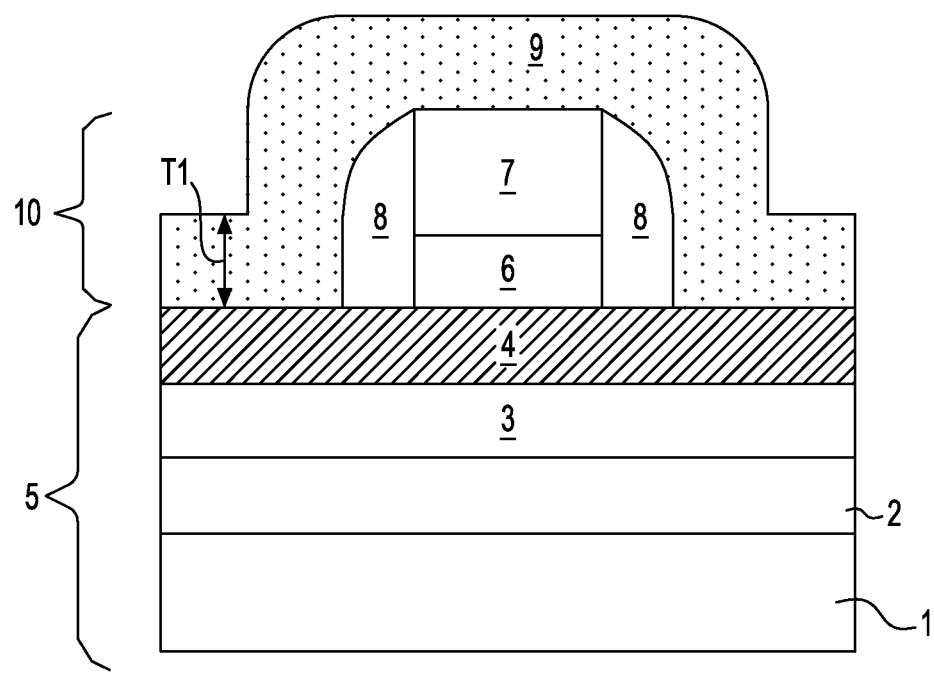
FIGS. 3 and 4 are side cross-sectional views depicting forming a spacer adjacent to the spacer of the gate structure, in accordance with one embodiment of the present disclosure.
Figure 4:
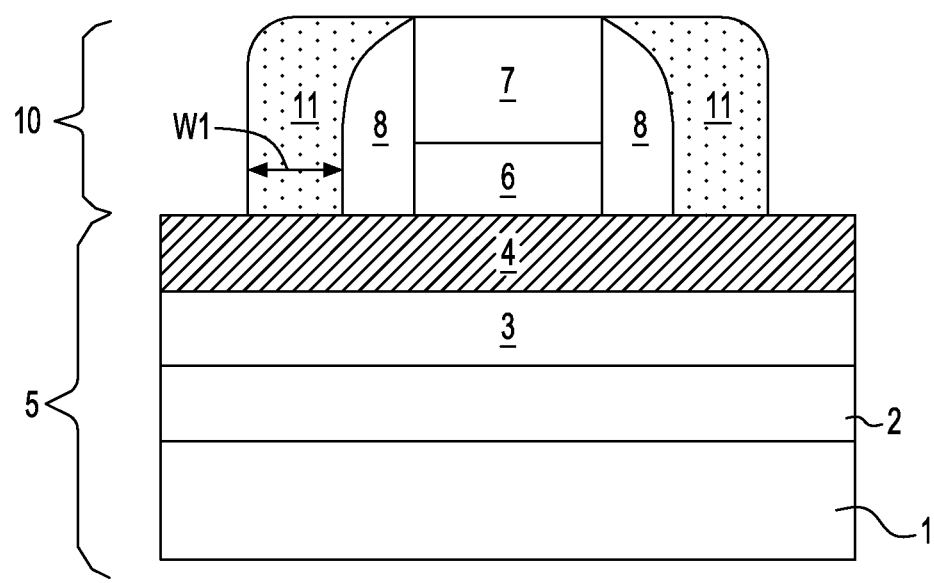

FIGS. 3 and 4 depicting one embodiment of forming a spacer 11 adjacent to the at least one dielectric gate spacer 8 of the gate structure 10. In one embodiment, the at least one dielectric gate spacer 8 may then be formed adjacent to the gate structure 10, i.e., in direct contact with the sidewall of the gate structure 10. In some embodiments, forming the spacer 11 may begin with a conformal deposition of a spacer material layer 9 on the gate structure 10, the at least one dielectric gate spacer 8 and the exposed portions of the surface of the III-V semiconductor substrate 5. The term "conformal" denotes a layer having a thickness that does not deviate from greater than or less than 20% of an average value for the thickness of the layer.

Referring to FIG. 3, the spacer material layer 9 may be composed of a nitride, oxide, oxynitride material, and/or any other suitable dielectric layer. The spacer material layer 9 may be formed by a deposition process, such as chemical vapor deposition (CVD) and/or atomic layer deposition (ALD). Alternatively, the material layer that provides the spacer material layer 9 may be formed using a growth process, such as thermal oxidation or thermal nitridation. The spacer material layer 9 may have a thickness T1 ranging from 1 nm to 100 nm.

Referring to FIG. 4, the spacer 11 may be formed from the spacer material layer 9 that is depicted in FIG. 3 by an anisotropic etchback method. An anisotropic etch process is a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation. Following the anisotropic etchback method, the horizontal portions of the spacer material layer are removed, and the vertical portions of the spacer material layer remain to provide the spacer 11 adjacent to the at least one dielectric gate spacer 8 of the gate structure 10. The width W1 of the spacer 11 that is adjacent to the at least one dielectric gate spacer 8 of the gate structure 10 may range from 2.0 nm to 30.0 nm. In another example, the width W1 of the spacer 11 that is adjacent to the at least one dielectric gate spacer 8 of the gate structure 10 may range from 5.0 nm to 15.0 nm.

Figure 5:
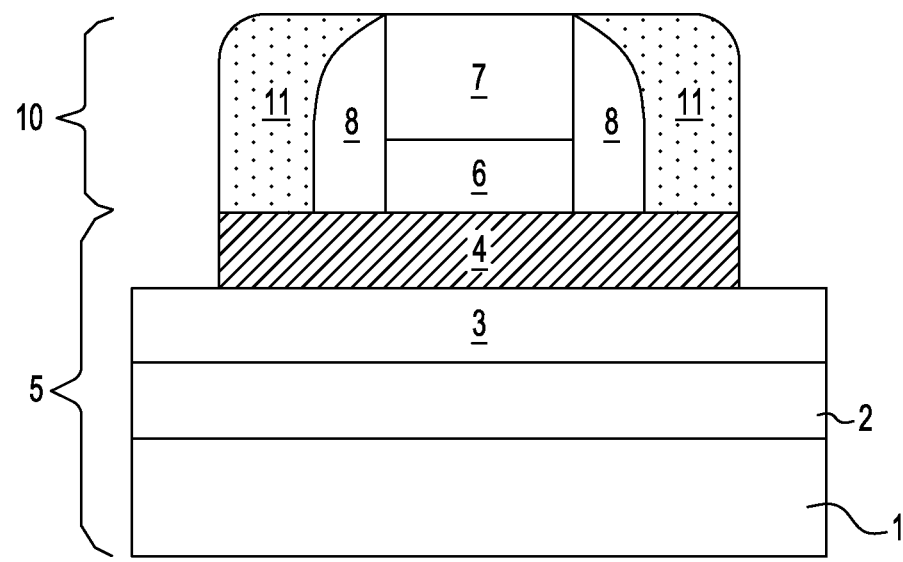
FIG. 5 is a side cross-sectional view depicting etching an exposed portion of the III-V channel layer to expose the portion of the aluminum containing III-V semiconductor layer on opposing sides of the gate structure, in accordance with one embodiment of the present disclosure.

FIG. 5 depicts etching an exposed portion of the III-V channel layer 4 to expose the portion of the aluminum containing III-V semiconductor layer 3 on opposing sides of the gate structure 10. In one embodiment, the etch process for removing the exposed portion of the III-V channel layer 4 may be an anisotropic etch. Examples of anisotropic etch processes for removing the exposed portions of the III-V channel layer 4 may include reactive-ion etching (RIE), ion beam etching, plasma etching, laser ablation or a combination thereof. In some embodiments, the etch process for removing the III-V channel layer 4 may be selective to the aluminum containing III-V semiconductor layer 3. As used herein, the term "selective" in reference to a material removal process denotes that the rate of material removal for a first material is greater than the rate of removal for at least another material of the structure to which the material removal process is being applied. In some examples, the selectivity may be greater than 100:1.

Figure 6:
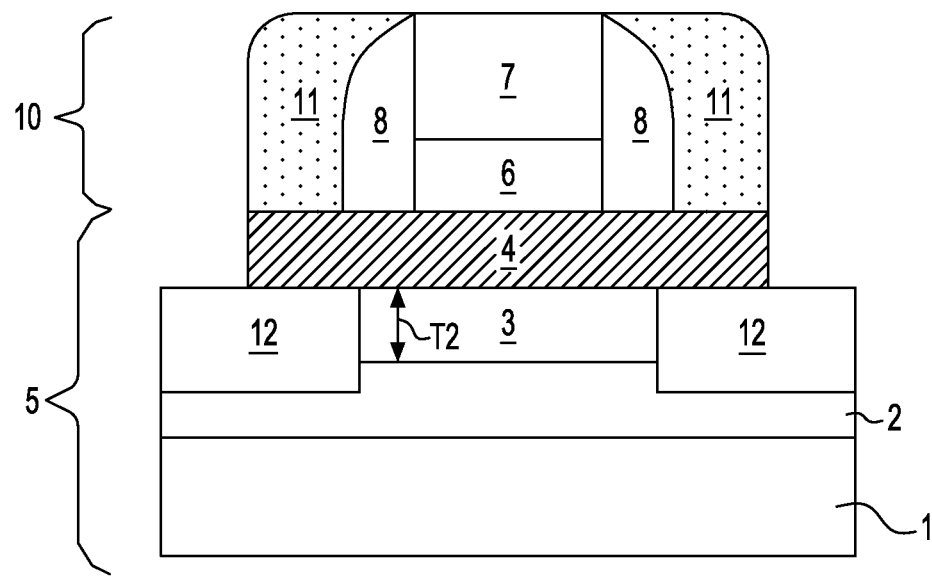
FIG. 6 is a side cross-sectional view depicting one embodiment of oxidizing a portion of the aluminum containing III-V semiconductor layer on opposing sides of the gate structure, in accordance with the present disclosure.

FIG. 6 depicts one embodiment of oxidizing a portion of the aluminum containing III-V semiconductor layer 3 on opposing sides of the gate structure 10. The oxidized portion of the aluminum containing III-V semiconductor layer 3 may be referred to as aluminum containing oxide regions 12. The portion of the aluminum containing III-V semiconductor layer 3 that is not oxidized between the aluminum containing oxide regions 12 may be referred to as "an island of undoped III-V aluminum containing semiconductor". In one example, the aluminum containing oxide regions 12 may be composed of aluminum oxide ($Al_2O_3$). The aluminum containing oxide regions 12 may also be composed of aluminum oxynitride (AlON) (e.g., $Al_{23}O_{27}N_5$). It is noted that the above compositions for the aluminum containing oxide regions 12 are provided for illustrative purposes only. For example, the aluminum containing oxide regions 12 may also be composed of aluminum and oxygen with at least one additive selected from the group consisting of Mg, Ca, Ba, Ti, V, Cr, Co, Ni, Cu, Ga, Ge, Zr, Nb, Mo, Ru, Hf, Ta, W, Li, B, Si, Y, Sc and combinations thereof. In some embodiments, the aluminum containing oxide regions 12 consume the entire thickness T2 of the aluminum containing III-V semiconductor layer 3. In some embodiments, the aluminum containing oxide regions 12 extend into a portion of the thickness of the ground plane layer 2. However, in some instances the aluminum containing oxide regions 12 do not consume the entire thickness of the ground plane layer 2.

In some embodiments, oxidizing a portion of the aluminum containing III-V semiconductor layer 3 on opposing sides of the gate structure 10 may include applying a wet oxidizing chemistry to the portion of the aluminum containing III-V semiconductor layer 3 that was exposed by etching away the portion of the III-V channel layer 4, which is described above with reference to FIG. 5. Referring to FIG. 6, in some embodiments, the wet oxidizing chemistry is an oxygen containing liquid, such as water. For example, the wet oxidizing chemistry may include exposing the aluminum containing layer at the temperature ranging from 350° C. to 450° C. to the wafer vapor flow with carrier gas (such as $N_2$).

In some embodiments, oxidizing a portion of the aluminum containing III-V semiconductor layer 3 on opposing sides of the gate structure 10 may include applying a thermal oxidation process to the portion of the aluminum containing III-V semiconductor layer 3 that was exposed by etching away the portion of the III-V channel layer 4, which is described above with reference to FIG. 5. Referring to FIG. 6, in some embodiments, the thermal oxidation process may include applying a higher temperature anneal process to the aluminum containing III-V semiconductor layer 3 in an oxygen containing atmosphere. For example, the thermal oxidation process may include exposing the aluminum containing layer at the temperature ranging from 450° C. to 550° C. to the oxidizing gas (such as $O_2$, $CO_2$, or $N_2O$).

The above described wet oxidizing and thermal oxidizing processes are provided for illustrative purposes only and are not intended to limit the present disclosure. For example, other methods may be employed to form the aluminum containing oxide regions 12.

Figure 7:
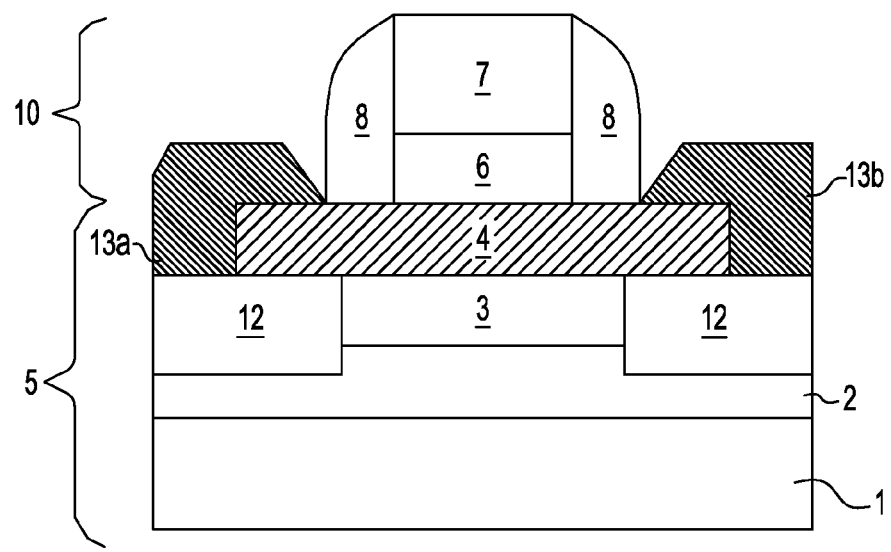
FIG. 7 is a side cross-sectional view depicting one embodiment of forming a raised source region and a raised drain region over the portion of the aluminum containing III-V semiconductor layer that has been oxidized.

FIG. 7 depicts one embodiment of forming a raised source region 13a and a raised drain region 13b over the portion of the aluminum containing III-V semiconductor layer 3 that has been oxidized. The term "raised" as used to describe the raised source region 13a and the raised drain region 13b means that the lower surface of the raised source region 13a and the raised drain region 13b that is adjacent to the gate structure 10 is in direct physical contact with the surface of the III-V channel layer 4 on which the gate dielectric of the gates structure 10 is present. The raised source region 13a and the raised drain region 13b may be formed using a selective epitaxial growth process. The terms "epitaxial growth and/or deposition" and "epitaxially formed" mean the growth of a semiconductor material on a deposition surface of a semiconductor material, in which the semiconductor material being grown has the same crystalline characteristics as the semiconductor material of the deposition surface. The fact that the process is selective means that the deposited semiconductor material grows only on exposed semiconductor regions and does not grow on a dielectric, such as silicon oxide. The epitaxial growth process may be continued until the raised source region 13a and the raised drain region 13b have a height ranging from 5 nm to 50 nm, as measured from the upper surface of the III-V channel layer 4.

The raised source region 13a and the raised drain region 13b may be composed of a III-V semiconductor material, such as gallium arsenic (GaAs). Other examples of III-V semiconductor materials that are suitable for the raised source region 13a and a raised drain region 13b include aluminum antimonide (AlSb), aluminum arsenide (AlAs), aluminum phosphide (AlP), boron phosphide (BP), boron arsenide (BAs), gallium arsenide (GaAs), gallium phosphide (GaP), indium phosphide (InP), aluminum gallium arsenide (Al-GaAs), indium gallium phosphide (InGaP), indium gallium arsenide (InGaAs), aluminum indium arsenic (AlInAs), aluminum indium antimonide (AlInSb), gallium arsenide nitride (GaAsN), gallium arsenide antimonide (GaAsSb), aluminum gallium phosphide (AlGaP), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), gallium indium nitride arsenide aluminum antimonide (GaInNAsSb), gallium indium arsenide antimonide phosphide (GaInAsSbP) and combinations thereof.

Similar to the source and drain regions that are formed in the III-V channel layer 4, the conductivity type of the raised source region 13a and the raised drain region 13b typically dictates the conductivity type of the semiconductor device. In some embodiments, the dopant that dictates the conductivity type of the raised source region 13a and a raised drain region 13b is introduced in-situ. By "in-situ" it is meant that the dopant that dictates the conductivity type of the raised source region 13a and the raised drain region 13b is introduced during the process step, e.g., epitaxial deposition, that forms the raised source region 13a and a raised drain region 13b. Alternatively, the dopant that provides the conductivity type of the raised source region 13a and the raised drain region 13b is introduced by ion implantation.

Figure 8:
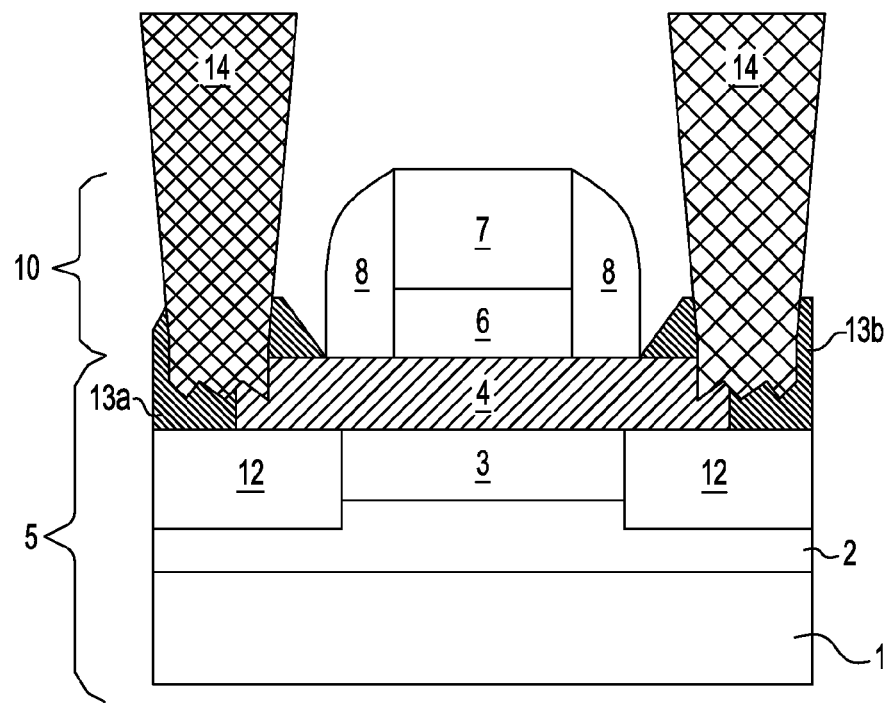
FIG. 8 is a side cross-sectional view depicting forming interconnects to the raised source region and the raised drain region, wherein the portion of the aluminum containing III-V semiconductor layer that has been oxidized obstructs penetration of the interconnects to the ground layer, in accordance with one embodiment of the present disclosure.

FIG. 8 depicts forming interconnects 14 to the raised source region 13a and the raised drain region 13b, wherein the oxidized portion of the aluminum containing III-V semiconductor layer, i.e., the aluminum containing oxide regions 12, obstructs penetration of the interconnects 14 from reaching the ground plane layer 2. In some embodiments, forming the interconnects 14 may begin with forming an interlevel dielectric layer (not shown) over the structure that is depicted in FIG. 7. The interlevel dielectric layer may be composed of a material selected from the group consisting of silicon-containing materials such as $SiO_2$, $Si_3N_4$, $SiO_xN_y$, SiC, SiCO, SiCOH, and SiCH compounds, the above-mentioned silicon-containing materials with some or all of the Si replaced by Ge, carbon-doped oxides, inorganic oxides, inorganic polymers, hybrid polymers, organic polymers such as polyamides or SiLK™, other carbon-containing materials, organo-inorganic materials such as spin-on glasses and silsesquioxane-based materials, and diamond-like carbon (DLC, also known as amorphous hydrogenated carbon, α-C:H). Additional choices for the interlevel dielectric layer include any of the aforementioned materials in porous form, or in a form that changes during processing to or from being porous and/or permeable to being non-porous and/or non-permeable. The interlevel dielectric layer may be deposited using at least one of spinning from solution, spraying from solution, chemical vapor deposition (CVD), plasma enhanced CVD (PECVD), sputter deposition, reactive sputter deposition, ion-beam deposition, and evaporation.

Via openings may then be formed through the interlevel dielectric layer to expose the portions of the raised source region 13a and the raised drain region 13b that are to be contacted with the interconnects 14. The via openings may then be filled with a conductive material, such as a metal, to provide the interconnects 14 to the raised source region 13a and the raised drain region 13b, as depicted in FIG. 8. The conductive material that provides the interconnects 15 may be a metal selected from the group consisting of aluminum, copper, platinum, silver, gold, titanium or combinations thereof. The conductive material that provides the interconnects 15 may be deposited using physical vapor deposition, plating, sputtering, electroplating, electroless deposition, chemical vapor deposition or combinations thereof.

The interconnects 14 are obstructed from penetrating to the III-V ground plane layer 2 by the aluminum containing oxide regions 12. As used herein, "obstructed" and "obstructing", as used to describe the relationship between the interconnects 14 and the aluminum containing oxide regions 12 means that the aluminum oxide regions 12 act as a diffusion barrier to the elements of the interconnects 14. By obstructing the interconnects 14 from penetrating through the III-V ground plane layer 2, the leakage current through the III-V semiconductor substrate 5 may be substantially reduced if not eliminated. Further, the doped ground plane layer 2 prevents the penetration of the electrical field between the source and drain regions and therefore substantially reduce the short channel effects.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor device comprising:
   a III-V base semiconductor layer;
   a III-V ground plane layer present on the III-V base semiconductor layer;
   an island of undoped III-V aluminum containing semiconductor layer that is present on the III-V ground plane layer;
   aluminum containing oxide regions on opposing sides of the island of the undoped III-V aluminum containing semiconductor layer;
   a III-V channel layer that is present on the island of the undoped III-V aluminum containing semiconductor layer;
   a raised III-V source region and a raised III-V drain region are present on the aluminum containing oxide regions and positioned on opposing sides of the III-V channel layer; and
   a gate structure on the III-V channel layer.

2. The semiconductor device of claim 1, wherein interconnects are formed to the raised III-V source region and the raised III-V drain region, and wherein said interconnects are obstructed from penetrating to the III-V ground plane layer by the aluminum containing oxide regions.

3. The semiconductor device of claim 1, wherein the III-V ground plane layer is doped to an n-type conductivity.

4. The semiconductor device of claim 1, wherein the III-V ground plane layer is comprised of aluminum arsenic (AlAs).

5. The semiconductor device of claim 1, wherein the aluminum containing oxide regions are comprised of aluminum oxide ($Al_2O_3$).

6. The semiconductor device of claim 1, wherein the III-V base semiconductor layer is comprised of gallium arsenic (GaAs).

7. The semiconductor device of claim 1, wherein the island of the undoped III-V aluminum containing semiconductor layer is comprised of aluminum arsenic (AlAs).

8. The semiconductor device of claim 1, wherein the III-V channel layer comprise gallium arsenic (GaAs).

9. The semiconductor device of claim 1, wherein the raised III-V source region and the raised III-V drain region are comprised of gallium arsenic (GaAs).

* * * * *